(12) United States Patent
Beatty (10) Patent No.: US 8,781,765 B2
(45) Date of Patent: Jul. 15, 2014

(54) ONLINE MONITORING SYSTEM AND METHOD TO IDENTIFY SHORTED TURNS IN A FIELD WINDING OF A ROTOR

(75) Inventor: Keith Franklin Beatty, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 477 days.

(21) Appl. No.: 13/084,115

(22) Filed: Apr. 11, 2011

(65) Prior Publication Data

US 2012/0259563 A1   Oct. 11, 2012

(51) Int. Cl.
*G01R 31/00* (2006.01)
*G01R 31/34* (2006.01)

(52) U.S. Cl.
USPC ........................ 702/59; 324/765.01

(58) Field of Classification Search
USPC ........................ 702/59; 324/765.01
See application file for complete search history.

(56) References Cited

U.S. PATENT DOCUMENTS

| | | | |
|---|---|---|---|
| 3,855,529 A | 12/1974 | Langweiler | |
| 4,136,312 A | 1/1979 | Salon et al. | |
| 4,164,705 A | 8/1979 | Whitney et al. | |
| 4,230,961 A | 10/1980 | Calfo et al. | |
| 4,377,784 A | 3/1983 | Saito et al. | |
| 4,377,833 A | 3/1983 | Udren | |
| 4,506,218 A | 3/1985 | Brown et al. | |
| 4,667,148 A | 5/1987 | Albright et al. | |
| 4,849,690 A | 7/1989 | Hughes | |
| 5,252,915 A | 10/1993 | Sedding et al. | |
| 6,466,009 B1 | 10/2002 | Dehaan et al. | |
| 6,798,210 B2 | 9/2004 | Goodrich et al. | |
| 6,847,224 B2 | 1/2005 | Lee et al. | |
| 6,882,173 B1 | 4/2005 | Nelson et al. | |
| 6,911,838 B2 * | 6/2005 | Rao et al. | 324/765.01 |
| 7,098,560 B2 | 8/2006 | Humphries et al. | |
| 7,372,676 B2 | 5/2008 | Cullen et al. | |

OTHER PUBLICATIONS

"Detection of Shorted Turns in Genetator Field Windings", GE Energy Services, gepower.com, pp. 1-2 (pre-2010).
"Generator Field Winding Shorted Turn Detector (Flux Probe)", GE Installation and Service Engineering Steam Turbine, GET 6987A, Revised, Nov. 1991, Reformatted, Apr. 1992, pp. 1-22.
D.R. Albright, "Interturn Short-Circuit Detector for Turbine-Generator Rotor Windings", Presented at the Institute of Electrical and Electronics Engineers Summer Power Meeting and EHV Conference, Jul. 12-17, 1970, pp. 1-12.

* cited by examiner

*Primary Examiner* — John Breene
*Assistant Examiner* — Manuel Rivera Vargas
(74) *Attorney, Agent, or Firm* — Nixon & Vanderhye P.C.

(57) ABSTRACT

A method for analyzing electrical shorts in field windings of a synchronous machine having a rotor using a magnetic flux probe, the method includes: monitoring flux signals generated by the flux probe wherein the flux signals are indicative of magnetic flux emanating from the field windings; electronically storing flux data obtained from the monitored flux signals and indicative of electrical shorts in the field windings; automatically analyzing the stored flux data to identify field windings having the shorts and to count the shorts in each identified field winding, and automatically displaying information identifying the field windings with shorts and a number of shorts in each field winding.

18 Claims, 7 Drawing Sheets

Shorted Turn Monitoring System

2% of total turns are shorted

| Coil | Detected Shorts | Last Analysis |
|------|-----------------|---------------|
| 1 | - | No data |
| 2 | - | No data |
| 3 | - | No data |
| 4 | 1 | 5/14/2010 |
| 5 | 3 | 5/14/2010 |
| 6 | - | No data |
| 7 | - | No data |
| 8 | - | No data |
| 9 | - | No data |

FIG. 6

| | Pole: X | Pole: Y | Last Detected | First Short(s) Detected | |
|---|---|---|---|---|---|
| Coil | # of Shorts | # of Shorts | | # of Shorts | Date |
| 1 | 0 | 0 | | | |
| 2 | 0 | 0 | | | |
| 3 | 0 | 0 | | | |
| 4 | 1 | 0 | | 1 | 5/14/2010 |
| 5 | 0 | 3 | 5/14/2010 | 3 | 5/14/2010 |
| 6 | 0 | 0 | 5/14/2010 | | |
| 7 | 0 | 0 | | | |

FIG. 7

ONLINE MONITORING SYSTEM AND METHOD TO IDENTIFY SHORTED TURNS IN A FIELD WINDING OF A ROTOR

BACKGROUND OF THE INVENTION

The present invention relates to the detection and monitoring of electrical shorts in synchronous machine field windings and, in particular, automatically identifying and tracking electrical shorts in the field windings of rotors.

The field windings in the rotor of a generator are generally an annular array of conductive coil bars arranged in slots around the outer periphery of the rotor. The coils extend longitudinally along the length of the rotor and are connected by end turns at each end of the rotor. A connected pair of coil bars and end turns form a coil winding turn.

A rotor has multiple poles, e.g. two, four or six poles. Several coil winding turns are arranged on a rotor to form a pole. An exciter circuit applies DC (direct current) to the coil bars of the rotor.

Shorts may develop in the field windings. For example, the insulation separating the conductor bars or end turns may break down and cause an electrical short across one or more coils in the field winding. The shorts in the coil windings are referred to as shorted turns.

A short in a field winding may cause a variety of overheating conditions and related vibration problems. Identification of shorted turns in a timely and cost-effective manner is desirable to reduce the off-line downtime period needed to repair shorts in the coil windings of the generator.

Shorts may be detected by analyzing the magnetic flux generated by the field windings. A flux probe sensor is introduced in the air-gap between the rotor and stator to monitor the flux from the field windings of the rotor. The sensor generates a signal proportional to the rate of change of the electromagnetic flux in the air-gap.

A system for flagging shorted turns in the coil windings of a generator is disclosed in U.S. Pat. No. 6,911,838, ('838 patent) entitled "Online Detection Of Shorted Turns In A Generator Field Winding" and assigned to the General Electric Company. The system '838 patent teaches an automated technique to analyze magnetic flux data captured from the rotor and flag the captured flux data likely to be indicative of a shorted coil.

SUMMARY OF INVENTION

There is a long felt need for a computer based system which automatically collects and generates information regarding electrical shorts in rotor field windings and presents the information in a manner which readily identifies the location, number and severity of the shorts.

A method has been conceived for analyzing electrical shorts in field windings of a synchronous machine having a rotor using a magnetic flux probe, the method includes: monitoring flux signals generated by the flux probe wherein the flux signals are indicative of magnetic flux emanating from the field windings; electronically storing flux data obtained from the monitored flux signals and indicative of electrical shorts in the field windings; automatically analyzing the stored flux data to identify field windings having the shorts and to count the shorts in each identified field winding, and automatically displaying information identifying the field windings with shorts and a number of shorts in each field winding.

The method may compare the flux data from one pole of the generator with flux data obtained from another pole of the generator to identify the shorts in the field windings. Similarly, the method may compare the flux data from one pole of the generator with flux data obtained from another pole of the generator to identify the number of shorts in each coil having a short. The comparisons of the flux data may include comparing amplitudes of flux probe signals corresponding to each field winding for a plurality of poles.

In addition, the method may correlate the zero crossing region with a peak amplitude to identify a corresponding coil in the rotor and approximate a load on the generator. The flux signals may be monitored over a full range of operational loads of the synchronous machine and the analyzed flux data includes flux data captured over the full range of operational loads.

The method may automatically assign a level of severity of the shorts based on a relative position of the field winding having the short and a magnetic pole of the rotor. The level of severity may be based on the number of shorts in each coil. The automatic assignment of the level of severity may include a level for each coil having an identified short.

A system has been conceived for analyzing electrical shorts in rotor field windings of a synchronous machine having a rotor using a magnetic flux probe, said system comprising: a flux probe monitoring magnetic flux in a gap between the rotor and a stator of the synchronous machine; a display device presenting information regarding electrical shorts in the rotor; a computer system receiving a flux signal from the flux probe and including a non-transitory electronic storage device having a program which when executed causes the computer system to: electronically store flux data obtained from the flux signals, wherein the flux data is indicative of electrical shorts in the field windings; automatically analyze the stored flux data to identify field windings having the shorts and to count the shorts in each identified field winding, and automatically display on the display device information identifying the coils with shorts and a number of shorts in each field winding.

The program may further cause the computer system to compare the flux data from one pole of the generator with flux data obtained from another pole of the generator during one complete rotor revolution to identify the shorts in the field windings, and to compare flux data from one pole of the generator with flux data obtained from another pole corresponding to a similar coil to identify a number of shorts in each coil having a short. The comparison of flux data includes a comparison of amplitudes of flux probe signals corresponding to each coil having a short.

The program may caus the computer system to correlate the rotor position with the flux data to determine the flux data corresponding to each of the field windings. Further, the computer system may correlate the zero crossing region with a peak amplitude of flux data to approximate a load on the generator.

DETAILED DESCRIPTION OF THE DRAWINGS

Figure 1:
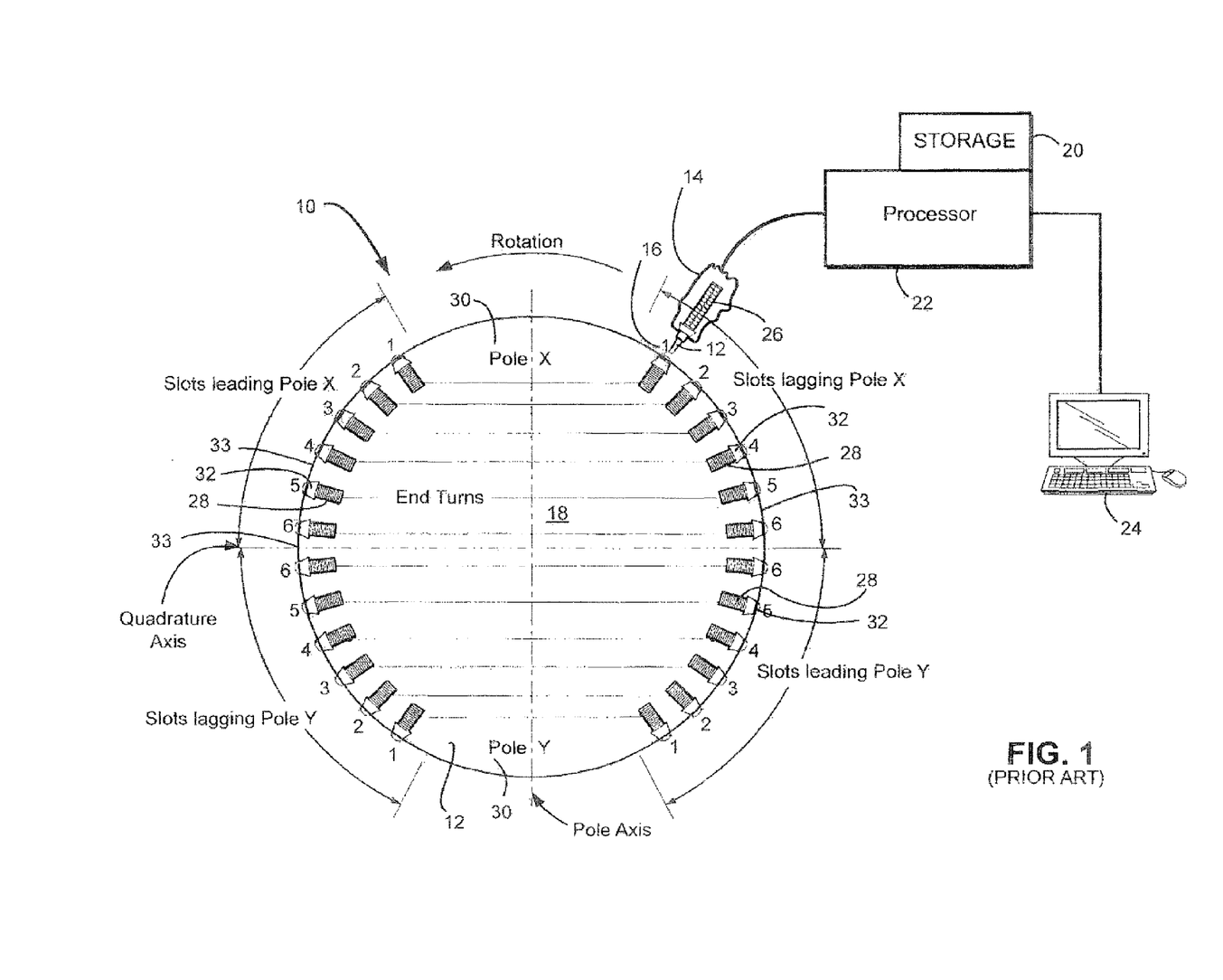
FIG. 1 is a cross-sectional diagram of a conventional 2-pole generator having a stator winding, a rotor field winding (coil) and a magnetic flux probe.

FIG. 1 shows a conventional system to collect magnetic flux data from the rotor of an electromagnetic machine, such as a generator 10. A magnetic flux probe 12 is temporarily or permanently fixed in a stator 14 of the generator and senses magnetic flux in the gap 16 between the stator and a rotor 18. Data from the flux probe 12 is automatically collected while the generator is on-line and producing electrical power.

The collected data is stored in a non-transient electronic storage device 20 to be analyzed by a computer system 22 executing a stored computer program for identifying shorts in the coils of the generator field winding, collecting and storing data regarding the shorts, and presenting information regarding the shorts on a display device 24.

FIG. 1 is a cross-sectional view of a synchronous dynamo-electric machine such as, a large industrial generator, having a rotor 18 and stator 14 to produce electric power. A rotating magnetic fields generated by the rotor induce a current in the coils of the stator. High alternating current (AC) output power is conventionally generated in the stator winding 26 which operates as an armature.

Field windings 28 of coils on the rotor 18 are conventionally excited by a direct current (DC) field supply. The DC field supply is generated either by an external DC exciter generator and fed through slip rings to the rotor field windings or via a brushless generator-rectifier assembly rotating with the rotor. Current from the DC exciter generator flows through the coils of the field windings.

Rotors 18 of large turbine-generators conventionally have two, four or more poles 30 formed by the arrangement of the lateral slots in the rotor that contain the field windings 28 and by interconnecting the windings with end turns proximate to the longitudinal ends of the rotor.

For purposes of illustration, a two-pole generator is described herein, although the invention is not limited to two-pole generators. The rotor coil windings 28 are symmetrically arranged in the slots with respect to each pole axis 30. Each coil winding may be in the slots for each of the poles in the rotor. The rotor coil windings when in the slots form an annular array around the axis of the rotor.

An annular air-gap 16 between the outer cylindrical surface of the rotor 18 and the inner surface of the stator 14 separates the rotor field windings 28 from the armature field windings 26. The flux probe 12 extends radially through the stator 14 and into the air gap 16. The magnetic sensor is typically on the end of the flux probe in or facing the air gap.

The flux probe 12 senses the slot leakage flux. The leakage of flux of the rotor field windings 28. This flux leakage is indicative of the rotor movement and, in particular, the alternating passage of rotor windings 28 in the slots 32, and the rotor teeth. As the rotor turns, the windings/slots and teeth pass arranged on the rotor pass across the sensing field of the probe. The flux probe may generate a voltage proportional to the rate of change of the flux leakage due to the rotation of the rotor with respect to the flux probe.

The flux probe signal is collected by a computer system 22 that may be associated with an instrument monitoring the generator. The computer system may be on site with the generator or located at a remote location. The computer system may also be in data communication with a computer network which allows access to the computer system over the internet. The computer system 22 monitors in real time the voltage level signals from the flux probe signal record, captures and stores selected groups of these voltage levels and analyzes the voltage levels to detect potential shorted coils.

Figure 2:
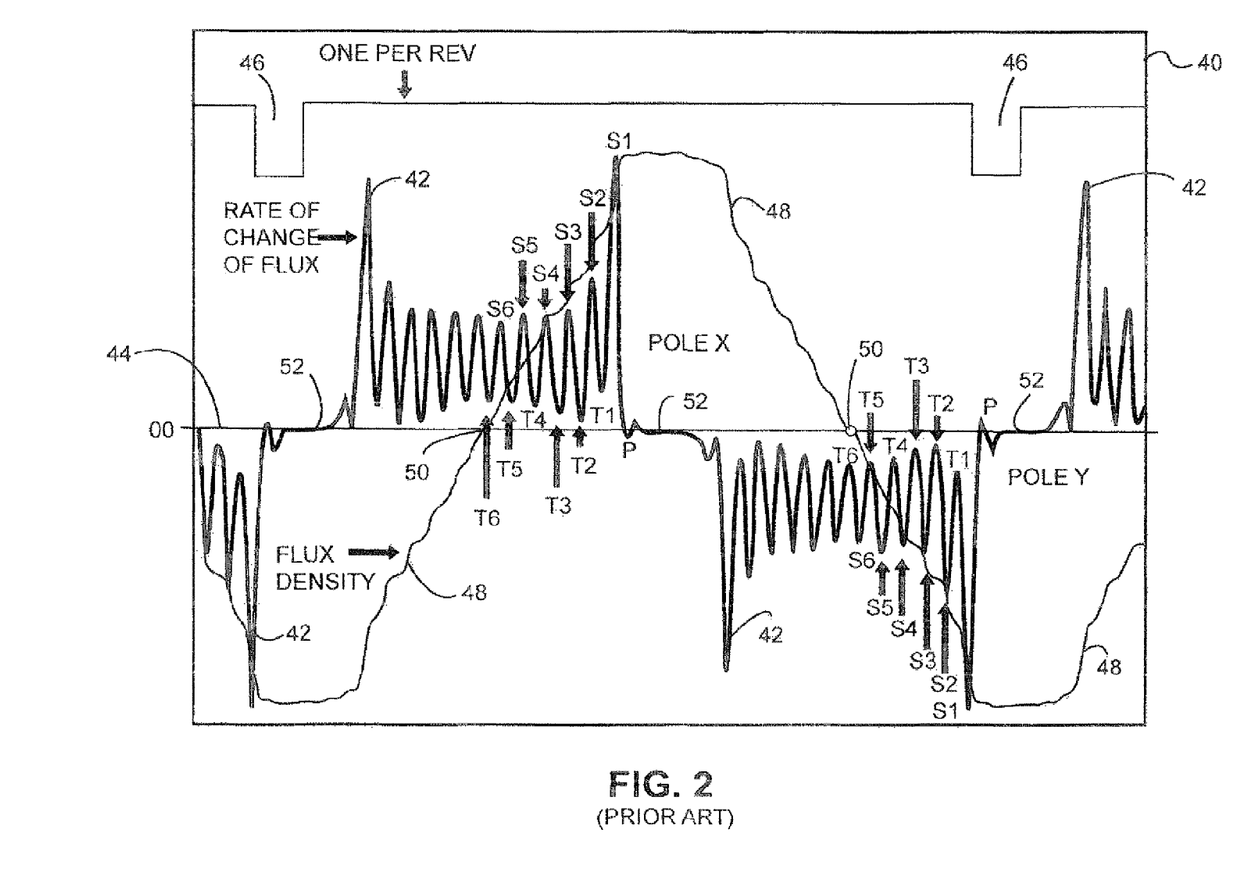
FIGS. 2, 3 and 4 are exemplary charts of a flux probe signal and flux density traces.

FIG. 2 is an exemplary chart 40 showing a flux probe voltage signal 42 verses time, represented by horizontal axis 44 of the chart. FIG. 2 illustrates a normal flux probe signal 42 and flux density line 48 and, particularly, shows the normal slot leakage voltage reversals of the rotor for one revolution of the rotor.

An upper time line has pulses 46 indicating each revolution of the rotor. The time line can be used to correlate the rotor angular position, e.g., slot position, to the trace of the flux probe signal 42. The amplitude of the flux probe signal is high as the slots (S1, S2, S3, S4, S5 and S6) having each of the coils pass the flux probe. The amplitude of the flux probe signal is low as the teeth (T1, T2, T3, T4, T5 and T6) of the rotor pass the flux probe. The flux probe signal oscillates as the probe passes over the slots/coils and teeth of the rotor.

The amplitude of the flux signal 42 corresponding to each slot is generally proportional to the number of active coil turns in the slot and the magnitude of the air-gap flux density. The flux probe voltage signal is integrated and displayed as the flux density line 48. Maximum flux density occurs at the leading edge (P) of each pole and progressively decreases toward the quadrature axis of the pole. The pattern of flux variation near the field winding is a signature characteristic of each field of a particular rotor and its generator.

The computer system 22, in real time, calculates and traces the rate of change of the flux 42 and the flux density 48, and determines the zero-crossing 50 of the flux density 48 or the zero-crossing 52 of the flux signal 42.

The computer system may also record and store the flux probe voltage signal and flux density data collected during certain periods, such as one rotor revolution. For example, the computer system may store data on flux and flux density for one revolution periods that correspond to shifts in the zero-crossing of the flux density and shorted coil(s).

The computer system may record other related electrical and load information, e.g., generator load, field voltage and field current corresponding to the recorded flux probe voltage levels and flux density data.

The flux signal 42 and flux density 48 traces cross the horizontal time axis 44 at a zero-crossing point(s) 50, 52. A zero crossing point 50 generally occurs once for each pole during each rotor revolution. The zero-crossing points should occur at the same time during each rotor revolution, if there is no change in the load on the generator. The flux probe signal, and hence the flux density trace and its zero-crossing points, will vary if the load on the generator changes.

The computer system may execute an algorithm to detect changes in zero-crossing points 40. The algorithm segments the area between the quadrature axis to the pole face into a series of regions that are in number at least twice the number of coils per pole. The computer system determines in which region the zero crossing 50, 52 occurs, and if the zero-crossing region differs from another rotor revolution. Changes in the region of the zero crossing indicate that the windings have experienced a load change. Detecting when the flux density zero crossing shifts from one region to another may provide sufficient resolution of zero crossing shifts to identify load changes.

The detection of the zero crossing from one region to another may be performed automatically by the computer system 22. The computer system may detect whether the zero cross shifts from one region to another based on a comparison of flux data (flux probe signals or integrated flux density data) obtained from successive rotor turns, a plurality of rotor turns over a predetermined period, such as a minute, hour or day, and from rotor turns obtained while the generator is operating at the same operational load conditions.

Figure 3:
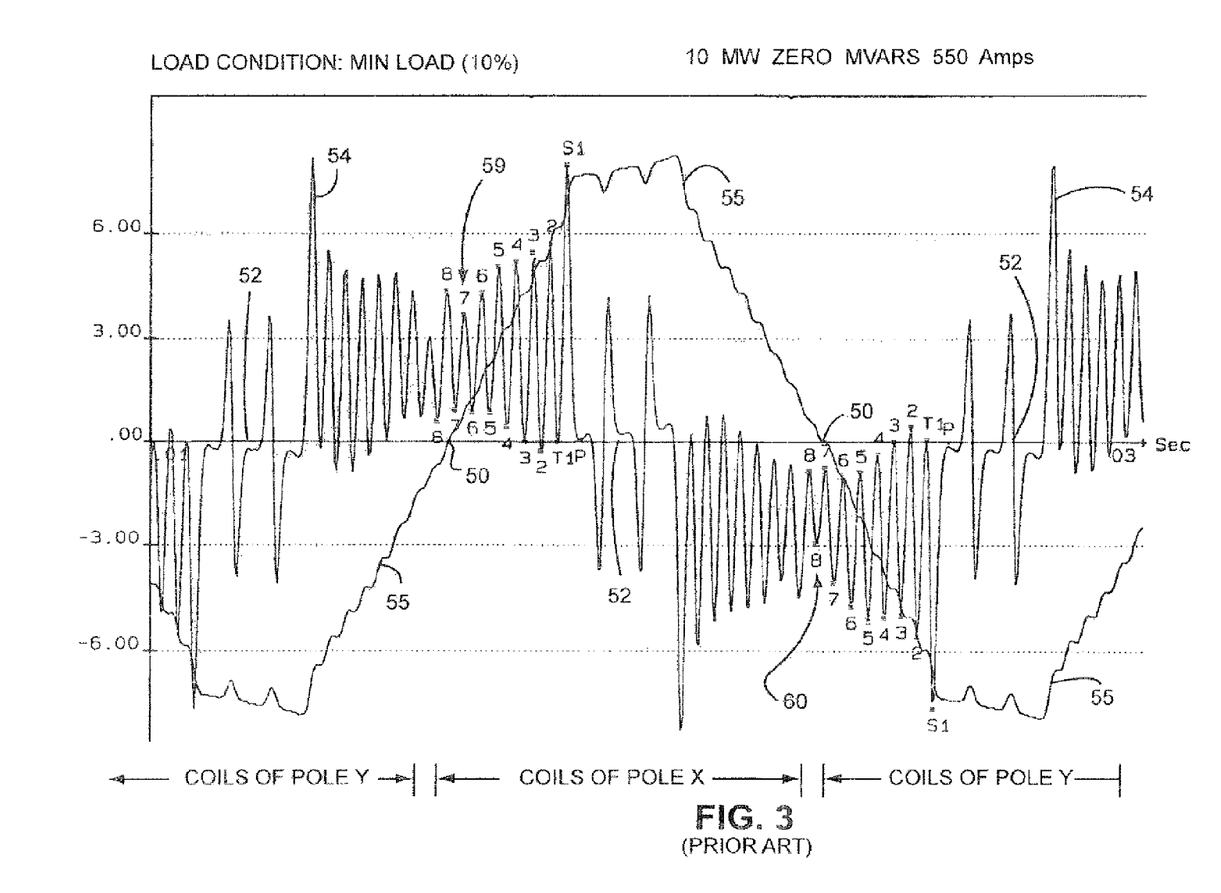
Figure 4:
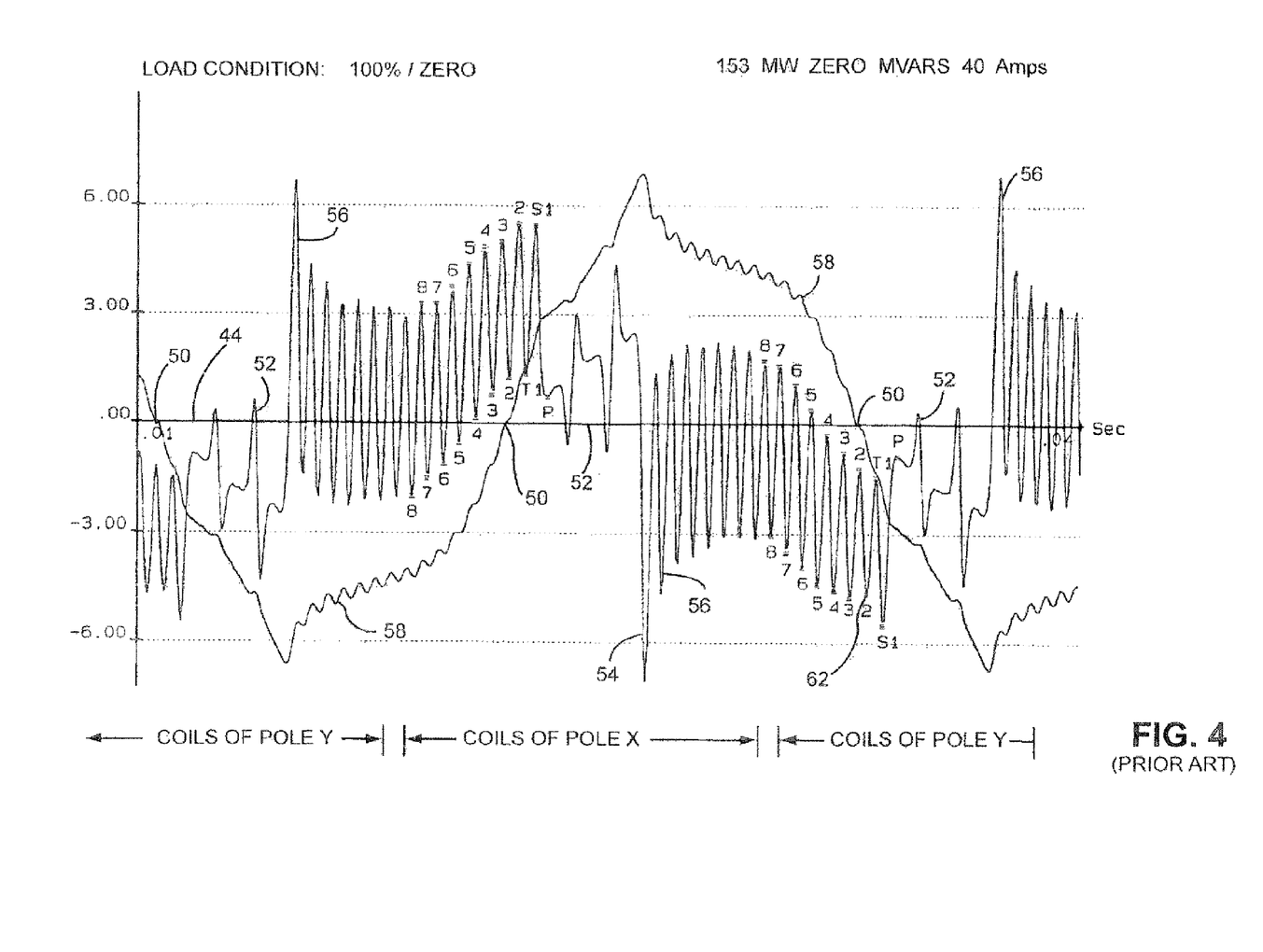

FIG. 3 is a chart of a flux probe voltage signal trace 54 and flux density trace 55 for a generator operating at ten percent (10%) load. FIG. 4 is a chart showing a flux probe voltage signal trace 56 and a flux density trace 58 for a generator operating at a full (100%) load. A comparison of FIG. 3 (10% load) and FIG. 4 (100% load) shows that a change in the load on the generator alters the flux probe signal 54, 56 the flux density trace 55, 58, and the zero-crossing points 50, 52 of the flux probe signal trace and the flux density.

An automatic zero-crossing detection algorithm included in an executable program held in the storage device 20 may be used to identify the zero-crossing of the flux density trace, identify which region of the nearest coil peak amplitude aligns with the zero-crossing and automatically store the flux data associated with the segment alignment of the coil peak amplitude and the zero-crossing.

The coils of each of the field windings associated with the pole X or pole Y of the rotor are indicated on FIGS. 3 and 4 by the reference numbers 1 to 6 associated with the flux probe signal trace 54, 56. A shorted turn in a coil is indicated by flux signal amplitudes 59, 60, 62 that are uncharacteristically small in comparison with the signal amplitudes for adjacent windings and the same coil of the opposite pole. The uncharacteristically short amplitudes 59, 60 and 62 in the flux signal for the shorted turns tend to appear once during each rotor revolution. As can be seen in FIGS. 3 and 4, the change in the flux signal amplitude due to a shorted coil is obscure and is not readily apparent in the flux prove single trace 54, 56 of one rotor turn.

An approach to identifying a shorted coil from the flux signal is to superimpose flux signals associated with multiple poles, e.g., opposite poles, obtained during one revolution of the rotor. To superimpose the flux signals, the flux probe signal associated with one pole may be inverted and overlaid with the flux probe signal associated with another pole on the rotor, such as the opposing pole. The differences between the superimposed flux signals, especially differences of peak amplitudes, may be used to identify shorts in a coil of the rotor. For example, a significant reduction in the peak amplitude of the flux signal associated with a coil in one pole as compared to the peak of the flux signal in the corresponding coil in another pole indicates that the coil has a short.

The number of shorts in each coil may be automatically determined by the computer system 22 analyzing the flux data. The flux probe signals shown in FIGS. 3 and 4 provide data indicating shorted turns in six of the eight coils. The shorts include three shorts in coil #2 of pole Y, two shorts in coil #7 of pole X, and five shorts in coil #8 of pole Y. The number of shorts in a coil is proportional to the reduction in the "sensitized" flux amplitude due to the shorts. By determining the proportional amount of reduction in the flux probe signal corresponding to a coil, the number of shorts in the coil can be estimated by the computer system.

An aberration in the flux field due to a shorted turn may not appear during all operating load conditions of the generator. The shorted field windings shown in FIG. 3 (see flux signals at 59, 60) correspond to shorts in a particular coil, e.g. 59 corresponds to coil #8 of pole Y and 60 corresponds to coil #7 of pole X. The shorted field winding 62 that appears in FIG. 4 corresponds to a short in coil #2 of pole Y.

The shorts in the coil for field windings #7 and #8 appear in the flux signal when the generator is under low loads as seen in FIG. 3 and do not appear when the generator is operating near full load (FIG. 4). The short in the coil for field winding #2 appears in the flux signal when the generator is operating near full load (FIG. 4) and not when the generator is near low loads (FIG. 3).

Because the shorts are not detectable from the flux data at all load conditions, flux probe data should be collected over a wide range of loads, e.g., 10 to 100 percent, to identify all shorts in the rotor field windings. Multiple traces of the flux signal that have been identified as being associated with a coil short are analyzed by the algorithm to identify each coil with short(s).

The slot leakage flux distortion factors tend to be minimal at the flux density zero crossing. For example, the flux density zero crossing point 50 shown in FIG. 2 is aligned with slot/coils 6 and 5. Thus, the flux data shown in FIG. 2 may be best used to determine shorts in the coil in slot 6. FIG. 3 shows the zero-crossing of the flux density to be aligned with slots 6 to 8. As such, the flux data shown in FIG. 3 might be best used to identify and count shorts in those slots. Similarly, FIG. 4 shows a zero crossing 50 of the flux density aligned with slots 3 to 1. Thus, the flux data shown in FIG. 4 may be best used to identify shorts and count shorts in those slots.

A computer system 22 that automatically identifies and counts shorts in a coil(s) for which the flux probe (coil) signal peak amplitude segment is aligned with the zero-crossing of the flux density. To identify and count shorts in each coil, the computer system may analyze flux data over a range of operation loads to find and analyze flux data in which the flux density zero-crossing is aligned with each of the slots/coil in the rotor.

In addition, an estimate of the operation load on a generator may be obtained based on which coil/slot corresponds to the flux probe signal peak segment which is in alignment with the zero-crossing of the flux density. As illustrated in FIG. 4, the operational load is at or near one hundred percent (100%) if the flux density zero crossing is aligned with the peak amplitude segment of the flux probe signal for a coil nearest or proximate to the pole, such as coils 1 to 3. In contrast, if the zero crossing 50 is aligned with the peak amplitude segment of the flux probe signal corresponding to a coil furthest away from the pole, the operational load may be low, such as at ten percent (10%) as shown in FIG. 3.

The computer system 22 may provide an estimate of the operational load on the synchronous dynamo-electric machine by matching the zero-crossing 50 of the flux density with a peak amplitude segment of the flux probe signal and identifying the coil associated with that peak amplitude segment. The computer system may have a correlation, such as a look-up table, from which is estimated the operational load based on the coil corresponding the flux density zero crossing.

The monitoring of flux data, detecting changes in the flux density zero-crossing point and capturing data when the zero-crossing point changes may be performed on an on-going basis by the computer system and while the generator remains on-line. Periodically, the generator may be run through a wide range of operating load conditions to generate flux probe signal data over substantially all operating load conditions. Collecting flux data over a wide range of operating loads and over an extended period of on-line operation should capture flux data sufficient to detect a shorted turn in any coil.

Figure 5:
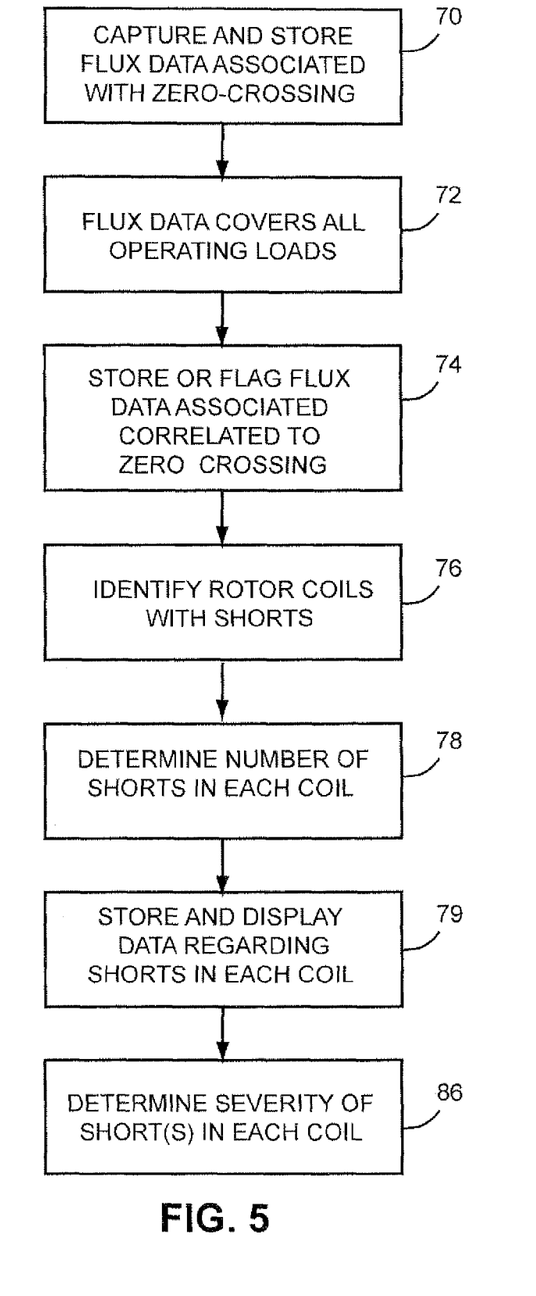
FIG. 5 is a flow chart showing exemplary steps for detecting electrical shorts in a rotor field winding.

FIG. 5 shows a flow chart of exemplary steps executed by the computer system 22 to identify shorts in the rotor field windings and, particularly, identify the number of shorts in each of the rotor field windings, and display data regarding the identified shorts.

In step 70, flux data is captured and stored in the electronic storage device 20 of the computer system 22. To capture the flux data a flux signal acquisition device may receive the data signal from the flux probe 12 and a signal indicating the angular position of the rotor. As the data signal is acquired for each pole of the rotor, a relay device associated with the flux signal acquisition device temporarily stores the flux data corresponding to each rotor pole and feeds the data to the computer system 22.

As the data is received, the computer system compares the flux data to previously received flux data for the corresponding rotor pole. Step 70 may be performed on an ongoing basis and may be repeatedly preformed before proceeding to step 72.

In step 72, a determination is made as to whether the flux probe data analyzed and captured in step 70 was collected while the generator has operated over a full range of operational loads, such as from ten percent load to one-hundred percent load. If it has not been under the full range, the operating range of the generator may be periodically cycled through the full range to ensure the flux probe data has been collected over the full range. Otherwise, the computer system may store a warning that the flux data has not been captured for the full range.

As noted above, capturing flux data over the full range of operational loads is useful to identify shorts in all of the rotor coils. Because shorts may be evident from the flux data only during certain operational loads of the generator, collecting flux data over the full range of operational loads may be necessary to identify all shorts.

In step 74, the computer system 22 stores the captured flux probe data, including data corresponding to the coil peak amplitude segment of the flux probe signal that is in alignment with or proximate to a flux density zero crossing.

In step 76, the computer system analyzes the flux data stored in step 74 to identify if a coil has a short. To automatically identify a short in a coil, the computer system may compare two sets of flux data, such as comparing flux probe signals from opposite poles acquired during one rotor rotation. The comparison may invert and superimpose the flux probe signals from the opposite pole(s). Differences between the peak amplitudes between the superimposed flux probe signals indicate a short in the coil associated with the lower peak amplitude.

The superimposed flux probe signal should be substantially aligned, if there is no short. For example, the flux probe signal from one pole should follow the same trace, except for being inverted, as the signal moves to another pole during a rotation of the rotor. The flux probe signal associated with a pole having a coil short will not closely track the flux probe signal of another pole. A difference between the superimposed flux probe signals from two (or more) poles can be used to automatically identify coils with shorts and the number of shorts in each coil. It is safely assumed that a coil in one coil will not be duplicated in a similar coil in another pole.

In addition to superposition of the flux probe signal, techniques which may be used to identify shorted coils include measuring the amplitude of the flux probe signal at times corresponding to the passage of the coils by the flux probe and determining whether the measured signals differ substantially for corresponding coils in different poles.

The flux signal is mapped to the angular rotor position and, particularly, to the coils on the rotor. A mapping of the rotor coils to the flux data is illustrated in FIGS. 2 to 4 which mark the flux signals associated with each coil. The coils are identified by numbers 1 to 6 in FIG. 2 and by numbers 1 to 8 in FIGS. 3 and 4.

Based on the differences between the superimposed flux probe signals and the mapping of the flux signals to the coils, the computer system 22 identifies the coil corresponding to the flux probe signal peak amplitude segment which is aligned with the flux density zero crossing. The computer system 22 determines if the absolute value of the peak of the flux probe signal associated with the identified coil is substantially reduced as compared to the absolute value of the peak of the flux probe signal for the corresponding coil in the opposite pole. The flux data for both of the poles may be obtained from the same rotation of the rotor.

The computer system analyzes each of the pairs of flux data collected in step 74 to identify the shorts and the number of shorts in each coil. A threshold proportional reduction, e.g., a ten percent reduction, between the same coils' amplitudes of each pole's flux probe signal may be used to determine if a coil has a short. Once a short has been identified, the computer system flags or otherwise identifies these pairs of flux data corresponding to each shorted coil.

In step 78, the computer system analyzes the flux probe signals associated with the shorted coils to determine the number of shorts in each coil. To determine the number of shorts, the computer system determines the amount of reduction in the flux probe signal due to the short(s). The greater the amount of reduction, the greater the number of shorted coils. The computer system may be programmed with ranges of reduction in the flux probe signal that correspond to one, two, three and possibly more shorts. For example, a reduction in the flux signal of 90 percent to 80 percent may correspond to one short in the rotor field winding coil. Similarly, a reduction in the flux signal of 80 percent to 60 percent corresponds to two shorts in the coil, and a reduction of 60 percent to 40 percent corresponds to three shorts in the coil.

The ranges corresponding to the numbers of shorts in each coil may vary for each coil in the rotor and vary from generator to generator. The ranges may be stored in the computer system for use in automatically determining the number of shorts in each rotor field winding.

Upon making the determination of which coils have shorts and the number of shorts, the computer system stores data identifying the coils with shorts and the date of the analysis in step 79.

Figure 6:
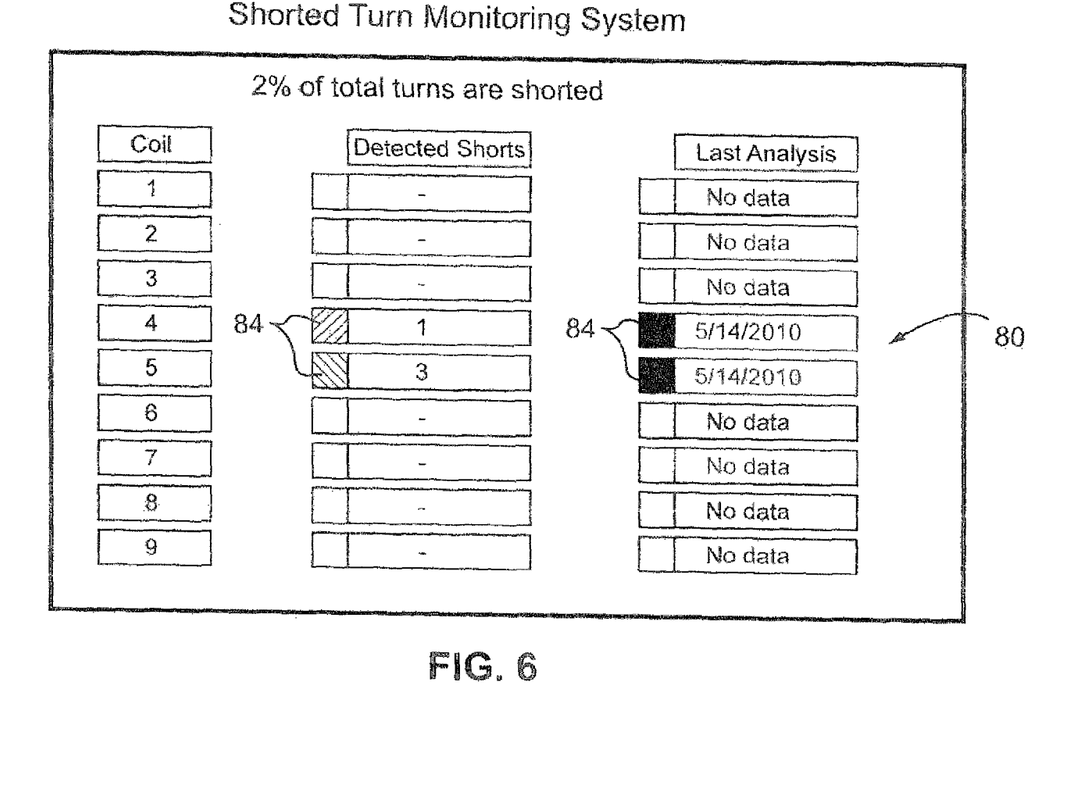
FIGS. 6 and 7 are exemplary illustrations of display images providing information regarding the detected generated by a computer system.

The data regarding the shorted rotor coils and the number of shorts in each coil is displayed by the computer system on a display screen showing a table 80 such as shown in FIG. 6. The table 80 presents information regarding shorts in coils for one generator having five rotor field windings (coils).

Figure 7:
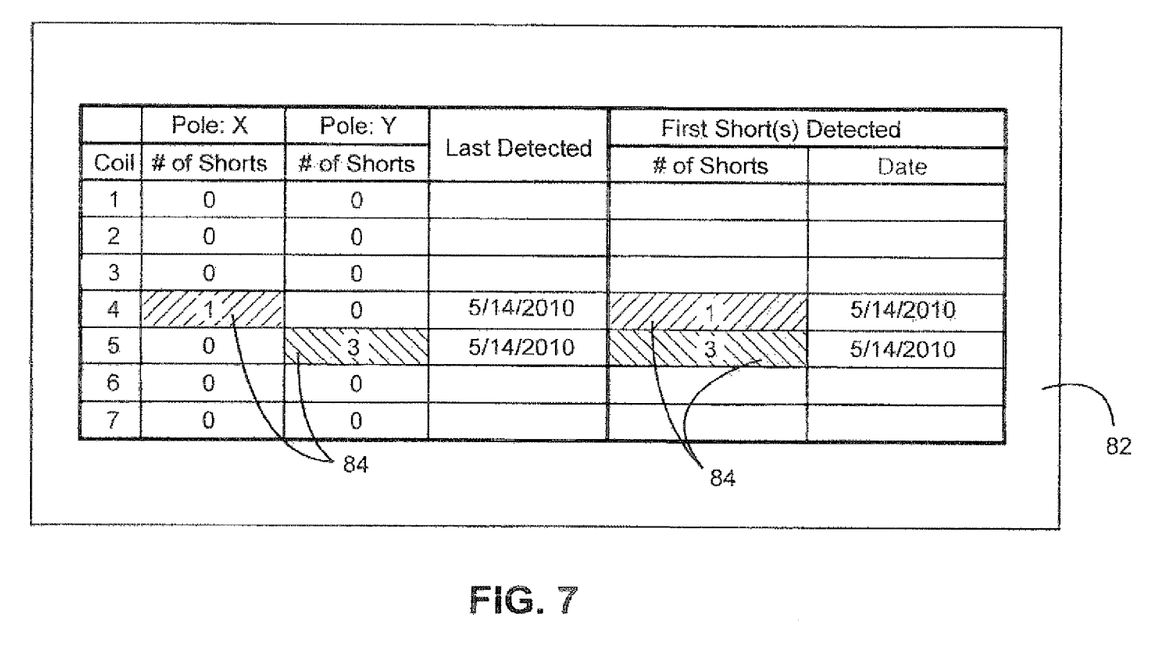

Similarly, FIG. 7 shows a display screen presenting a table 82. The format of the table 80, 82 and the data presented in the table may be selected to suit the individuals who will review the tables. For example, table 80 presents data for each coil of a generator which identifies the number of shorts in the coil and the data of the last analysis performed by the computer system on the flux data. Whereas table 80 presents information to identify which pole of each coil has a short(s) and when the first short was detected in each coil.

In addition, a color code 84 or other visual alarm may be shown to indicate the severity of the short(s) as it impacts generator performance. The color codes or flags may be selected by the computer system based on proximity of the shorted coil to the leading edge (P in FIG. 2) of each pole. Because the flux density is highest near the leading edge of each pole, a short in the coil (1 in FIG. 2) nearest the leading edge adversely affects the performance of the generator more than would a short in a coil further away from the pole.

In step 86, the computer system 22 determines the severity of the short(s) in each coil. The severity may be a table or function of the position of the shorted coil relative to the leading edge of the poles and the number of shorts in the coil. The table or function may be based on empirical data and the expertise of a skill person familiar with analyzing flux data to identify shorts in rotor coils and the impact of shorts on generator performance.

A table may identify a color code associated with the number of shorts in each coil. For example, a table may indicate that a single short in coils 1 or 2 (which are nearest the leading edge of the pole) may trigger a red (highest) warning, a single short in the other coils trigger a yellow warning, and two shorts in the other coils triggers a read warning. A function relating the shorted coil position and number shorts in the coil may include a weighting factor for each of the coils, wherein the coil nearest the leading edge of the pole has a heaviest weighting factor and the weighting factor for the other coils decreases in order of their proximity to the leading edge. Similarly, the function may use the number of shorts in each coil as a multiplier of the weighting factor. The function may generate a warning level, e.g., green, yellow or red, for the entire generator.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for analyzing electrical shorts in field windings of a synchronous machine having a rotor using a magnetic flux probe, said method comprising:
   monitoring flux signals generated by the flux probe wherein the flux signals are indicative of magnetic flux emanating from the field windings;
   electronically storing flux data obtained from the monitored flux signals and indicative of electrical shorts in the field windings;
   automatically counting the shorts in each identified field winding, wherein the counting of the shorts includes determining a degree of reduction in the flux data from one pole of the generator as compared to the flux data obtained from another pole of the generator and calculating the count of shorts based on the degree of the reduction, and the counting of the shorts further includes identifying a range which includes the degree of reduction wherein the range is one of a predefined group of ranges of reductions, and the count is determined based on the identified range, and
   automatically displaying information identifying the field windings with shorts and automatically displaying the count of the shorts in each field winding.

2. The method as in claim 1 further comprising automatically assigning a level of severity of the shorts based on a relative position of the field winding having the short with respect to a magnetic pole of the rotor.

3. The method as in claim 2 wherein the automatic assignment of the level of severity is based on the number of shorts in each coil.

4. The method as in claim 2 wherein the automatic assignment of the level of severity includes a level for each coil having an identified short.

5. The method as in claim 1 wherein the one pole of the generator is opposite to the another pole such that the poles are aligned along a radial line extending through a rotational axis of the generator.

6. The method as in claim 1 wherein the comparison of the flux data includes a comparison of amplitudes of flux probe signals corresponding to each field winding for a plurality of poles.

7. The method as in claim 1 further comprising correlating rotor position with the flux data to determine the flux data corresponding to each of the field windings.

8. The method as in claim 1 further comprising correlating a zero crossing region of the stored flux data with a peak amplitude of the stored flux data to approximate a load on the generator.

9. The method as in claim 1 wherein the flux signals are monitored over a full range of operational loads of the synchronous machine and the analyzed flux data includes flux data is captured over the full range of operational loads.

10. A system for analyzing electrical shorts in rotor field windings of a synchronous machine having a rotor using a magnetic flux probe, said system comprising:
    a flux probe monitoring magnetic flux in a gap between the rotor and a stator of the synchronous machine;
    a display device presenting information regarding electrical shorts in the rotor;
    a computer system receiving a flux signal from the flux probe and including a non-transitory electronic storage device having a program which when executed causes the computer system to:
    electronically store flux data obtained from the flux signals, wherein the flux data is indicative of electrical shorts in the field windings;
    automatically count the shorts in each identified field winding, wherein the counting of the shorts includes determining a degree of reduction in the flux data from one pole of the generator as compared to the flux data obtained from another pole of the generator and calculating the count of shorts based on the degree of the reduction, and the automatically counting includes identifying a range which includes the degree of reduction wherein the range is one of a predefined group of ranges of reduction, and the count is determined based on the identified range, and
    automatically display on the display device information identifying the coils with shorts and the count of the shorts in each field winding.

11. The system of claim 10 wherein the program further causes the computer system to assign a level of severity of the shorts based on a relative position of the field winding having the short with respect to a magnetic pole of the rotor.

12. The system of claim 11 wherein the automatic assignment of the level of severity is based on the number of shorts in each coil.

13. The system of claim 11 wherein the automatic assignment of the level of severity includes a level for each coil having an identified short.

14. The system of claim 10 wherein the one pole of the generator is opposite to the another pole such that the poles are aligned along a radial line extending through a rotational axis of the generator.

15. The system of claim 10 wherein the comparison of flux data includes a comparison of amplitudes of flux probe signals corresponding to each coil having a short.

16. The system of claim 10 wherein the program further causes the computer system to correlate the rotor position with the flux data to determine the flux data corresponding to each of the field windings.

17. The system as in claim 10 further comprising correlating a zero crossing region of the stored flux data with a peak amplitude of the stored flux data to approximate a load on the generator.

18. The system of claim 10 wherein the flux signals are monitored over a full range of operational loads of the synchronous machine and the analyzed flux data includes flux data captured over the full range of operational loads.

* * * * *